(12) United States Patent
Sakai (10) Patent No.: US 11,631,799 B2
(45) Date of Patent: Apr. 18, 2023

(54) ELASTIC WAVE DEVICE AND MANUFACTURING METHOD THEREFOR, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Ryosuke Sakai, Nagaokakyo (JP)

(73) Assignee: MURATA MANUFACTURING CO., LTD., Kyoto (JP)

(\*) Notice: Subject to any disclaimer, the term of this patent is extended or adjusted under 35 U.S.C. 154(b) by 1022 days.

(21) Appl. No.: 16/400,110

(22) Filed: May 1, 2019

(65) Prior Publication Data
US 2019/0259933 A1     Aug. 22, 2019

Related U.S. Application Data

(63) Continuation of application No. PCT/JP2017/033053, filed on Sep. 13, 2017.

(30) Foreign Application Priority Data

Nov. 29, 2016 (JP) .............................. JP2016-230916

(51) Int. Cl.
*H01L 41/047* (2006.01)
*H03H 9/145* (2006.01)
(Continued)

(52) U.S. Cl.
CPC ........... *H01L 41/0475* (2013.01); *H03H 3/02* (2013.01); *H03H 3/08* (2013.01);
(Continued)

(58) Field of Classification Search
CPC ................................... H03H 9/25; H03H 9/64
See application file for complete search history.

(56) References Cited

U.S. PATENT DOCUMENTS 8,193,038 B2 \* 6/2012 Uchida ................. H01L 23/585
                                                                    438/460
8,477,483 B2 \* 7/2013 Tsuda .................. H03H 9/1092
                                                                    257/676
(Continued)

FOREIGN PATENT DOCUMENTS

JP      2011-003674 A      1/2011
JP      2011-114332 A      6/2011
(Continued)

OTHER PUBLICATIONS

Official Communication issued in International Patent Application No. PCT/JP2017/033053, dated Oct. 31, 2017.

*Primary Examiner* — Hafizur Rahman
*Assistant Examiner* — Alan Wong
(74) *Attorney, Agent, or Firm* — Keating & Bennett, LLP (57) ABSTRACT

An elastic wave device includes a piezoelectric body including a main surface, an IDT electrode provided on the main surface of the piezoelectric body, and a wiring electrode provided on the main surface of the piezoelectric body and electrically connected to the IDT electrode, in which the wiring electrode includes a portion that extends to an edge of the main surface of the piezoelectric body, and a width of the wiring electrode on the edge is narrower than a width of the wiring electrode in a portion not on the edge.

12 Claims, 9 Drawing Sheets (51) Int. Cl.
*H03H 9/25* (2006.01)
*H03H 9/64* (2006.01)
*H03H 3/02* (2006.01)
*H03H 9/02* (2006.01)
*H03H 3/08* (2006.01)

(52) U.S. Cl.
CPC .... *H03H 9/02228* (2013.01); *H03H 9/02574* (2013.01); *H03H 9/02992* (2013.01); *H03H 9/145* (2013.01); *H03H 9/25* (2013.01); *H03H 9/6406* (2013.01); *H03H 9/6433* (2013.01)

(56) References Cited

U.S. PATENT DOCUMENTS

| | | | |
|---|---|---|---|
| 9,160,304 | B2* | 10/2015 | Mori ........................ H03H 9/54 |
| 9,634,226 | B2* | 4/2017 | Takahashi ............... H01L 41/29 |
| 10,171,061 | B2* | 1/2019 | Iwamoto .............. H03H 9/1457 |
| 2010/0320612 | A1 | 12/2010 | Uchida et al. |
| 2011/0176264 | A1* | 7/2011 | Tsuda ................... H03H 9/1092 361/679.01 |
| 2013/0167340 | A1 | 7/2013 | Nishidate |
| 2013/0307639 | A1 | 11/2013 | Mori |
| 2014/0009032 | A1* | 1/2014 | Takahashi .......... H03H 9/02228 29/25.35 |
| 2016/0163957 | A1 | 6/2016 | Ajima et al. |
| 2017/0222619 | A1* | 8/2017 | Iwamoto .................. H03H 9/54 |

FOREIGN PATENT DOCUMENTS

| | | |
|---|---|---|
| JP | 2013-138362 A | 7/2013 |
| JP | 2014-060806 A | 4/2014 |
| JP | 2015-138828 A | 7/2015 |
| WO | 2015/025618 A1 | 2/2015 |
| WO | 2016/084526 A1 | 6/2016 |
| WO | WO-2016084526 A1 * | 6/2016 ......... H03H 9/02574 |

* cited by examiner

ELASTIC WAVE DEVICE AND MANUFACTURING METHOD THEREFOR, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-230916 filed on Nov. 29, 2016 and is a Continuation Application of PCT Application No. PCT/JP2017/033053 filed on Sep. 13, 2017. The entire contents of each of these applications are hereby incorporated herein by reference.

BACKGROUND OF THE INVENTION

1. Field of the Invention

The present invention relates to an elastic wave device that is used as, for example, a resonator and a radio-frequency filter, a manufacturing method for the elastic wave device, a radio-frequency front-end circuit including the elastic wave device, and a communication device.

2. Description of the Related Art

Currently, elastic wave devices are widely used as resonators and radio-frequency filters.

Japanese Unexamined Patent Application Publication No. 2013-138362 discloses a method for manufacturing an elastic wave device by singulating a mother piezoelectric substrate on which a plurality of elastic wave chips are formed into pieces along split lines. When the mother piezoelectric substrate is singulated, laser light is emitted along the split lines. In Japanese Unexamined Patent Application Publication No. 2013-138362, the laser light is scanned such that at least a partial area of a metal layer that extends in directions in which the split lines extend is not irradiated.

However, wiring metal on the split lines is thick, and therefore, with the method for manufacturing an elastic wave device according to Japanese Unexamined Patent Application Publication No. 2013-138362, metal scraps from the wiring metal may be left on the split lines when the mother piezoelectric substrate is singulated. Accordingly, when the mother piezoelectric substrate is singulated, burrs (unwanted projections) from the wiring metal on the split lines may be produced.

SUMMARY OF THE INVENTION

Preferred embodiments of the present invention provide elastic wave devices and manufacturing methods for elastic wave devices, radio-frequency front-end circuits including the elastic wave devices, and communication devices in each of which burrs from a metal layer, such as a wiring electrode, are less likely to be produced.

An elastic wave device according to a preferred embodiment of the present invention includes a piezoelectric body including a main surface; an IDT electrode provided on the main surface of the piezoelectric body; and a wiring electrode provided on the main surface of the piezoelectric body and electrically connected to the IDT electrode, in which the wiring electrode includes a portion that extends to an edge of the main surface of the piezoelectric body, and a width of the wiring electrode on the edge is narrower than a width of the wiring electrode in a portion not on the edge.

In an elastic wave device according to a preferred embodiment of the present invention, a radius of curvature of the wiring electrode at the edge is equal to or less than about 3 μm. In this case, the production of burrs from a metal layer is able to be further reduced or prevented.

In an elastic wave device according to a preferred embodiment of the present invention, the elastic wave device further includes a high-acoustic-velocity member through which a bulk wave propagates at an acoustic velocity higher than an acoustic velocity of an elastic wave that propagates through the piezoelectric body; and a low-acoustic-velocity film that is stacked on the high-acoustic-velocity member and through which a bulk wave propagates at an acoustic velocity lower than the acoustic velocity of the elastic wave that propagates through the piezoelectric body, in which the piezoelectric body is provided on the low-acoustic-velocity film. In this case, the energy of the elastic wave is able to be more efficiently confined.

In an elastic wave device according to a preferred embodiment of the present invention, when a wavelength determined based on an electrode finger pitch of the IDT electrode is represented by $\lambda$, a thickness of the piezoelectric body is equal to or less than about $3.5\lambda$. In this case, the energy of the elastic wave is able to be more efficiently confined.

A manufacturing method for an elastic wave device according to a preferred embodiment of the present invention includes a step of forming a plurality of IDT electrodes and a wiring electrode electrically connected to the IDT electrodes on a first main surface of a mother piezoelectric body; and a step of splitting, along a split line, and singulating the mother piezoelectric body on which the plurality of IDT electrodes and the wiring electrode are provided into a plurality of pieces to manufacture elastic wave devices including the IDT electrodes and the wiring electrode, in which the wiring electrode is formed such that the wiring electrode includes a portion that crosses the split line, and the wiring electrode is formed such that a width of the wiring electrode on the split line is narrower than a width of the wiring electrode in a portion not on the split line.

In a manufacturing method for an elastic wave device according to a preferred embodiment of the present invention, before the mother piezoelectric body on which the plurality of IDT electrodes and the wiring electrode are provided is split, laser light is emitted onto the split line on a second main surface of the mother piezoelectric body opposite the first main surface.

A radio-frequency front-end circuit according to a preferred embodiment of the present invention includes an elastic wave device according to a preferred embodiment of the present invention; and a power amplifier.

A communication device according to a preferred embodiment of the present invention includes a radio-frequency front-end circuit according to a preferred embodiment of the present invention; and an RF signal processing circuit.

According to preferred embodiments of the present invention, it is possible to provide elastic wave devices and manufacturing methods therefor, radio-frequency front-end circuits, and communication devices in each of which burrs from a metal layer, such as a wiring electrode, are less likely to be produced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The preferred embodiments described herein are illustrative, and it should be noted that configurations in different preferred embodiments may be partially replaced or combined with one another.

First Preferred Embodiment

Figure 1:
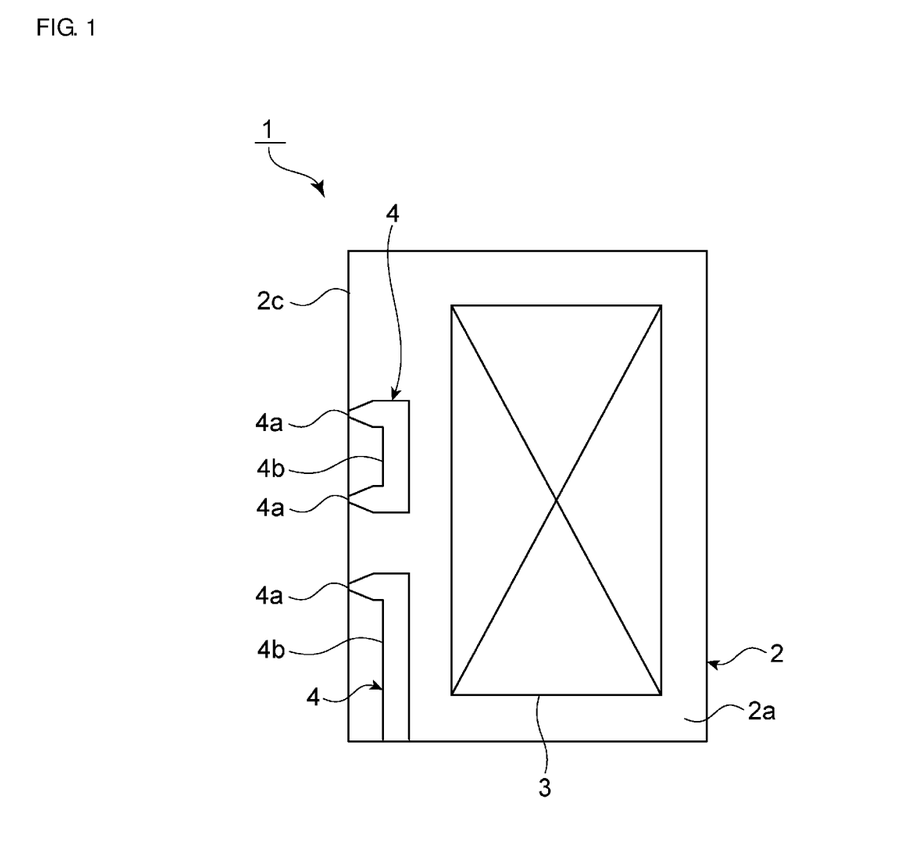
FIG. 1 is a schematic plan view of an elastic wave device according to a first preferred embodiment of the present invention.
Figure 2A:
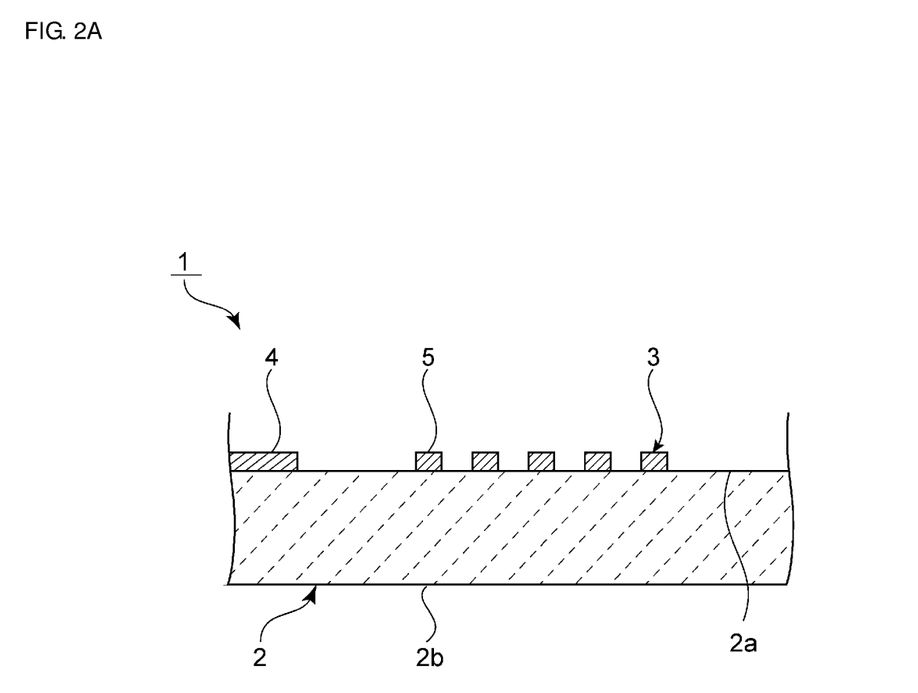
FIG. 2A is a schematic elevational cross-sectional view of the elastic wave device according to the first preferred embodiment of the present invention.
Figure 2B:
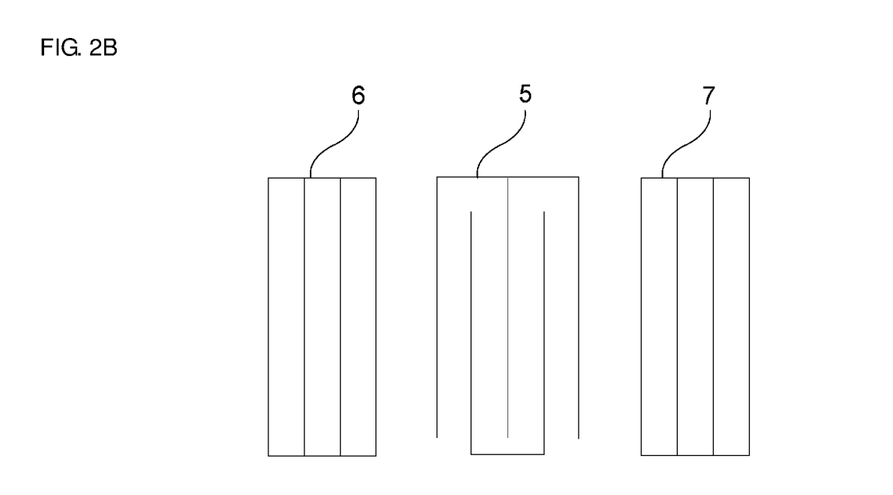
FIG. 2B is a schematic plan view of an electrode structure of the elastic wave device according to the first preferred embodiment of the present invention.

FIG. 1 is a schematic plan view of an elastic wave device according to a first preferred embodiment of the present invention. FIG. 2A is a schematic elevational cross-sectional view of the elastic wave device according to the first preferred embodiment of the present invention. FIG. 2B is a schematic plan view of an electrode structure of the elastic wave device according to the first preferred embodiment of the present invention.

As illustrated in FIG. 1, an elastic wave device 1 includes a piezoelectric body 2. In the present preferred embodiment, the piezoelectric body 2 is preferably a rectangular or substantially rectangular plate-shaped piezoelectric substrate. The material of the piezoelectric substrate is not specifically limited and, for example, a piezoelectric single crystal, such as $LiNbO_3$ or $LiTaO_3$, or a suitable piezoelectric ceramic may preferably be used.

As illustrated in FIG. 2A, the piezoelectric body 2 includes a first main surface 2a and a second main surface 2b opposite to each other. On the first main surface 2a of the piezoelectric body 2, first functional electrodes 3 including an interdigital transducer (IDT) electrode 5 are provided. Although not specifically limited, the first functional electrodes 3 preferably define, for example, a bandpass filter. However, in FIG. 1, the first functional electrodes 3 are schematically illustrated by a block diagram.

On the first main surface 2a of the piezoelectric body 2, a wiring electrode 4 is provided. In the present preferred embodiment, the wiring electrode 4 is preferably, for example, a power-feeding wiring line to define a via electrode with electrolytic plating. The via electrode is electrically connected to the IDT electrode 5. Therefore, the wiring electrode 4 is electrically connected to the IDT electrode 5.

The wiring electrode 4 includes end portions 4a. The end portions 4a are on an edge 2c of the first main surface 2a of the piezoelectric body 2. Note that the edge is the periphery of the elastic wave device 1 in plan view of the elastic wave device 1. The end portions 4a are thinner than a remaining portion 4b other than the end portions 4a of the wiring electrode 4. That is, the width of the wiring electrode 4 on the edge 2c is narrower than the width of the wiring electrode 4 in a portion not on the edge 2c. In the present preferred embodiment, portions of the wiring electrode 4 including the end portions 4a become thinner toward the end portions 4a. The planar shape of the end portions 4a may be a pointed shape or a rounded shape, for example.

As illustrated in FIG. 2A, the elastic wave device 1 includes the IDT electrode 5 provided on the first main surface 2a of the piezoelectric body 2. Note that the first functional electrodes 3 illustrated in FIG. 1 includes a plurality of IDT electrodes including the IDT electrode 5.

Although schematically illustrated in FIG. 2A, more specifically, the electrode structure illustrated in FIG. 2B is provided on the piezoelectric body 2. That is, the IDT electrode 5 and reflectors 6 and 7 disposed on the respective sides of the IDT electrode 5 in a direction in which a surface acoustic wave of the IDT electrode 5 propagates are provided. Accordingly, a one-port surface acoustic wave resonator is provided. Note that the reflectors 6 and 7 need not be included.

As illustrated in FIG. 2B, the IDT electrode 5 includes a first busbar, a second busbar, a plurality of first electrode fingers, and a plurality of second electrode fingers. The plurality of first electrode fingers and the plurality of second electrode fingers are interposed between one another. The plurality of first electrode fingers are connected to the first busbar, and the plurality of second electrode fingers are connected to the second busbar.

Although not illustrated, in the present preferred embodiment, a $SiO_2$ film that defines and functions as a frequency-temperature-characteristics adjusting film may cover the IDT electrode 5.

The material used for the wiring electrode 4 and the IDT electrodes is not specifically limited, and examples of the material include Cu, Ag, Au, Mo, W, Ta, Pt, Al, Ti, Ni, Cr, or an alloy thereof. The wiring electrode 4 and the IDT electrodes may include a single-layer metal film or a multilayer metal film including two or more different metal films that are stacked. From the viewpoint of further reducing or preventing production of burrs described below, it is preferable that the material of the wiring electrode 4 is a material having a high Young's modulus, such as W, Mo, or Ta, for example.

As described above, in the elastic wave device 1, the width of the wiring electrode 4 on the edge 2c is narrower than the width of the wiring electrode 4 in a portion not on the edge 2c. Therefore, in the elastic wave device 1, burrs from the wiring electrode 4 are less likely to occur. That is, production of burrs from the wiring electrode 4 is able to be reduced or prevented or burrs are able to be reduced in size. This will be described in detail in the following section regarding a manufacturing method. In the elastic wave device 1, burrs from the wiring electrode 4 are less likely to occur, and therefore, a short circuit between electrodes is less likely to occur. Therefore, in the elastic wave device 1, it is possible that the characteristics are less likely to be degraded.

Now, a non-limiting example of a manufacturing method for the elastic wave device 1 is described.

Figure 3:
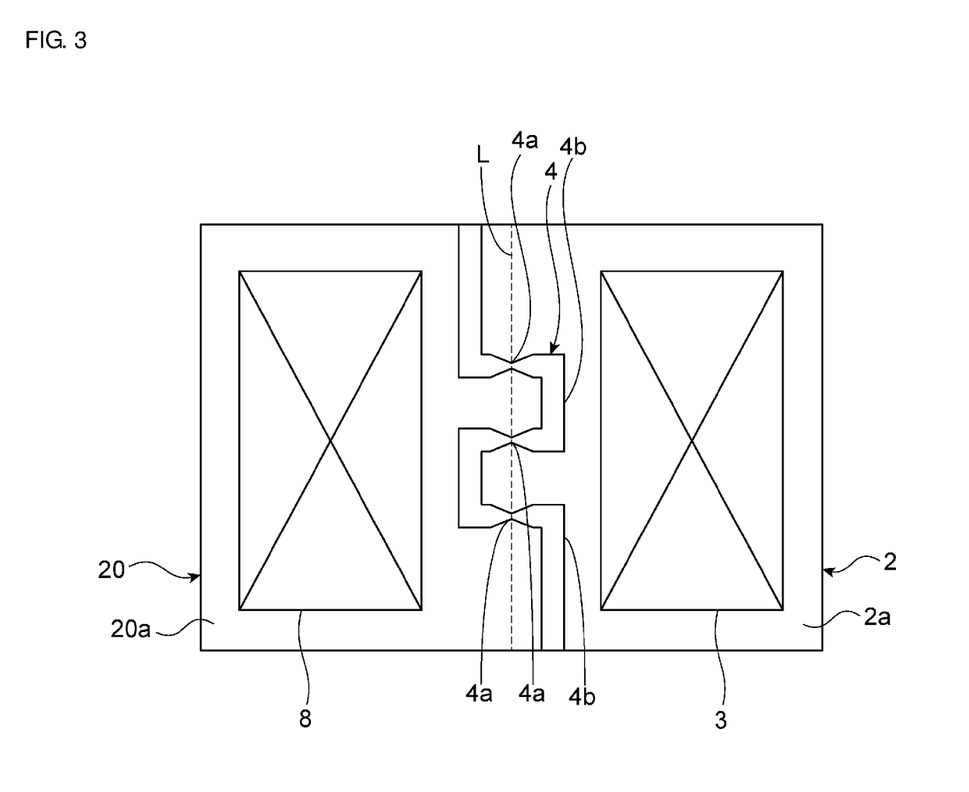
FIG. 3 is a schematic plan view for describing a manufacturing method for the elastic wave device according to the first preferred embodiment of the present invention.

FIG. 3 is a schematic plan view for describing the manufacturing method for the elastic wave device according to the first preferred embodiment of the present invention.

First, a mother piezoelectric body 20 illustrated in FIG. 3 is provided. The mother piezoelectric body 20 includes a first main surface 20a. In the present preferred embodiment, the mother piezoelectric body 20 is preferably a rectangular or substantially rectangular plate-shaped piezoelectric substrate. The material of the piezoelectric substrate is not specifically limited and, for example, a piezoelectric single crystal, such as $LiNbO_3$ or $LiTaO_3$, or a suitable piezoelectric ceramic may preferably be used.

Subsequently, on the first main surface 20a of the mother piezoelectric body 20, the first functional electrodes 3 and second functional electrodes 8 including a plurality of IDT electrodes and the wiring electrode 4 are formed. Note that, as illustrated in FIG. 3, the wiring electrode 4 is formed such that the wiring electrode 4 includes portions that cross a split line L represented by the dashed line. Further, the wiring electrode 4 is formed such that the width of the wiring electrode 4 on the split line L is narrower than the width of the wiring electrode 4 in a portion not on the split line L. Specifically, in the present preferred embodiment, the wiring electrode 4 is formed such that portions of the wiring electrode 4 including the portions of the wiring electrode 4 located on the split line L become thinner toward the split line L. Note that the split line L is a split line along which the mother piezoelectric body 20 is split.

The plurality of IDT electrodes used to form the first functional electrodes 3 and the second functional electrodes 8 may preferably be formed by, for example, a vapor deposition lift-off process. Further, the wiring electrode 4 may be formed by, for example, a vapor deposition lift-off process, a sputter lift-off process, vapor deposition etching, or plating.

In the vapor deposition lift-off process, by a photolithography process, a resist is processed into a shape in which the end portions 4a of the wiring electrode 4 have a thinner shape. Subsequently, an electrode film is formed on the entire or substantially the entire surface by vapor deposition, and thereafter, the resist is peeled off to form the wiring electrode in which the end portions 4a have a thinner shape. In the photolithography, a photosensitive resin, such as a resist, is illuminated with light through a photomask including a hole in a wiring shape to form a resist shape.

In the sputter lift-off process, a resist is processed into a shape in which the end portions 4a of the wiring electrode 4 have a thinner shape by photolithography, and thereafter, an electrode film is formed by sputtering. Subsequently, the resist is peeled off to form the wiring electrode 4 in which the end portions 4a have a thinner shape.

In the plating, a resist is processed into a shape in which the end portions 4a of the wiring electrode 4 has a thinner shape, and thereafter, an electrode film is formed by plating. Subsequently, the resist is peeled off to form the wiring electrode 4 in which the end portions 4a have a thinner shape.

Figure 4:
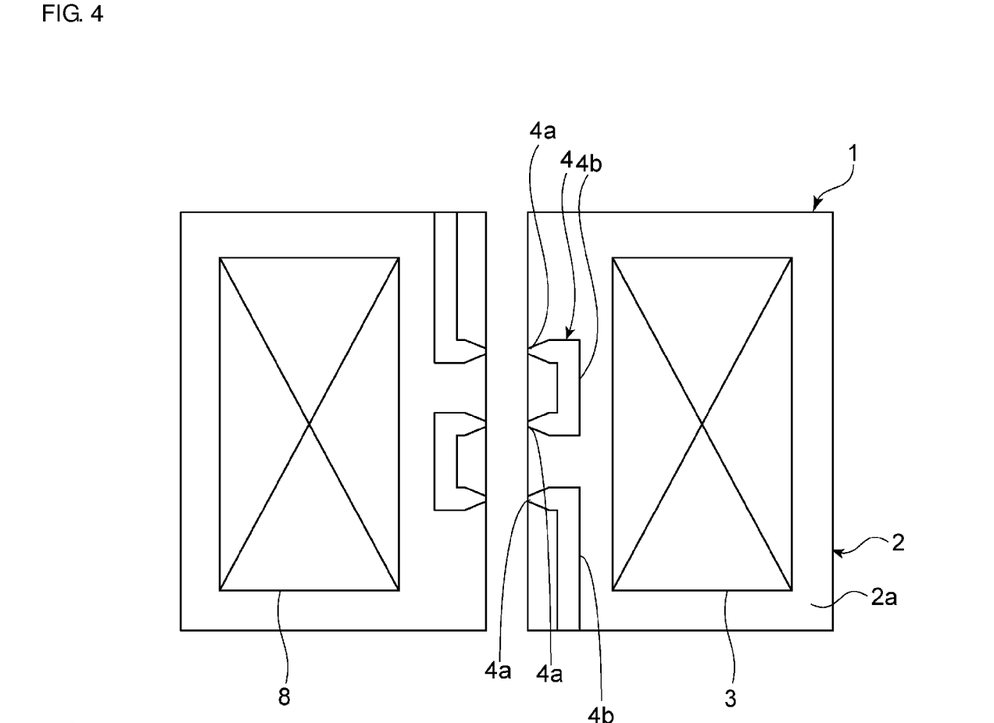
FIG. 4 is a schematic plan view for describing the manufacturing method for the elastic wave device according to the first preferred embodiment of the present invention.

Next, the mother piezoelectric body 20 on which the wiring electrode 4 and the plurality of IDT electrodes are provided is split into a plurality of pieces along the split line L to singulate the mother piezoelectric body 20, as illustrated in FIG. 4. Accordingly, the elastic wave device 1 is manufactured. Note that the elastic wave device 1 includes the first functional electrodes 3 formed of the plurality of IDT electrodes and the wiring electrode 4. Further, in the present preferred embodiment, the mother piezoelectric body 20 from which two elastic wave devices are manufactured by splitting is used. However, in preferred embodiments of the present invention, a mother piezoelectric body from which three or more elastic wave devices are manufactured by splitting may be used.

As described above, in the present preferred embodiment, the wiring electrode 4 is formed such that the width of the wiring electrode 4 on the split line L is narrower than the width of the wiring electrode 4 in a portion not on the split line L. Therefore, when the mother piezoelectric body 20 is split, the wiring electrode 4 is split in the thinner portions. At this time, the thinner portions of the wiring electrode 4 tend to be subjected to intensive stress. Therefore, the wiring electrode 4 are able to be cleanly split, and burrs from the wiring electrode 4 are less likely to be produced. As a consequence, with the manufacturing method according to the present preferred embodiment, the elastic wave device 1 is able to be manufactured in which burrs from the wiring electrode 4 are less likely to be produced and the split surface is satisfactory.

Figure 5:
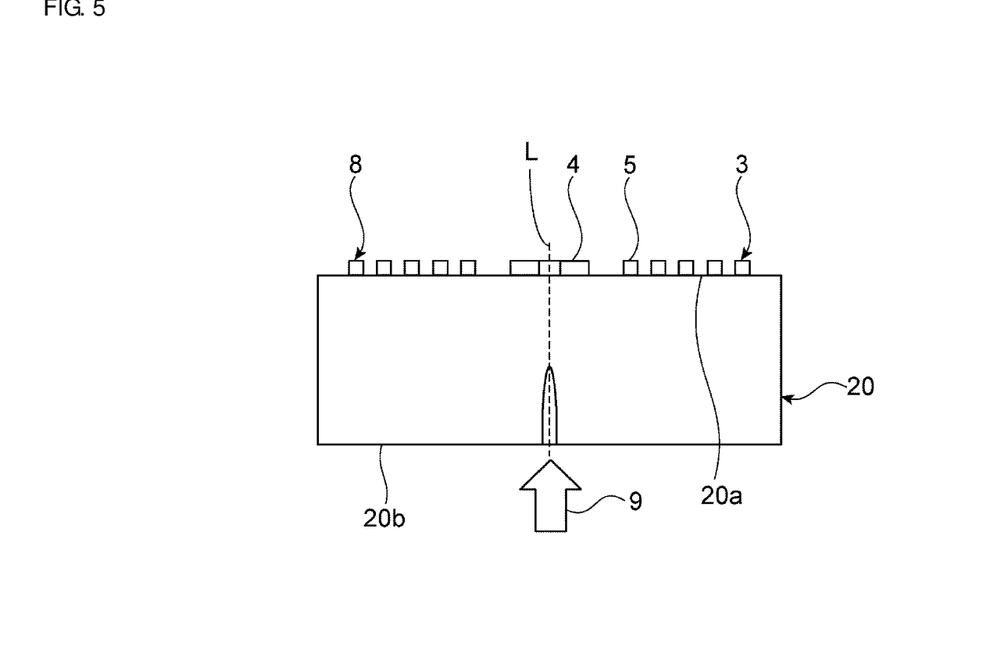
FIG. 5 is a schematic front view for describing a laser light irradiation method in the manufacturing method for the elastic wave device according to the first preferred embodiment of the present invention.
Figure 6:
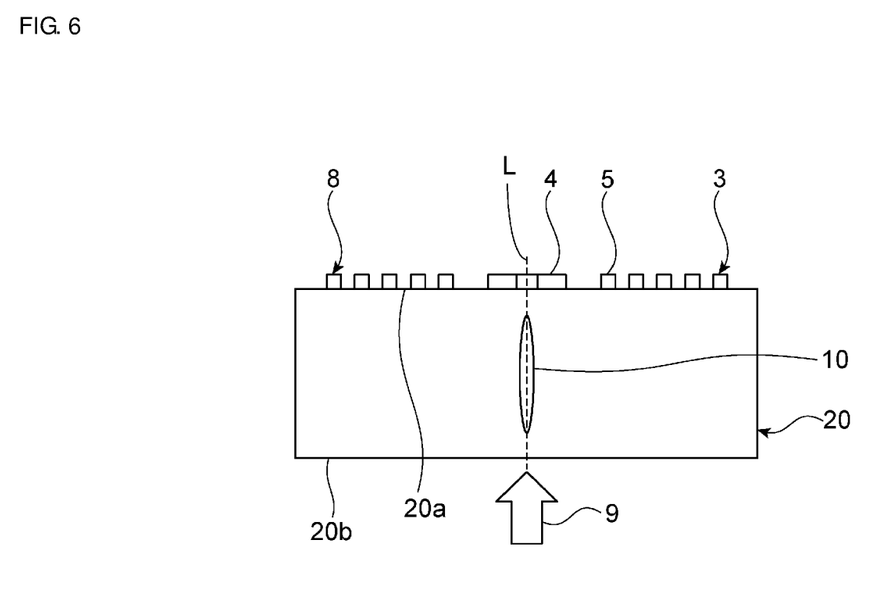
FIG. 6 is a schematic front view for describing a laser light irradiation method in the manufacturing method for the elastic wave device according to the first preferred embodiment of the present invention.

In the present preferred embodiment, it is preferable that laser light is emitted onto the split line L before the mother piezoelectric body 20 is split. In this case, as illustrated in FIG. 5 and FIG. 6, it is preferable to emit laser light 9 from the side of a second main surface 20b of the mother piezoelectric body 20. The second main surface 20b is a main surface opposite the first main surface 20a.

When the laser light 9 is emitted, the laser light 9 is scanned from the side of the second main surface 20b so as to partially cut the mother piezoelectric body 20 along the split line L, as illustrated in FIG. 5. Alternatively, as illustrated in FIG. 6, the focal position of the laser light 9 may be shifted to reform an internal portion of the mother piezoelectric body 20 and form a reformed layer 10 on the split line L. Note that the reformed layer 10 is formed when a portion of the mother piezoelectric body 20 is melted as a result of irradiation with the laser light 9 and the crystallinity thereof is impaired. Accordingly, when the reformed layer 10 is formed, the mother piezoelectric body 20 is able to be more easily split at the time of a break described below.

Figure 7A:
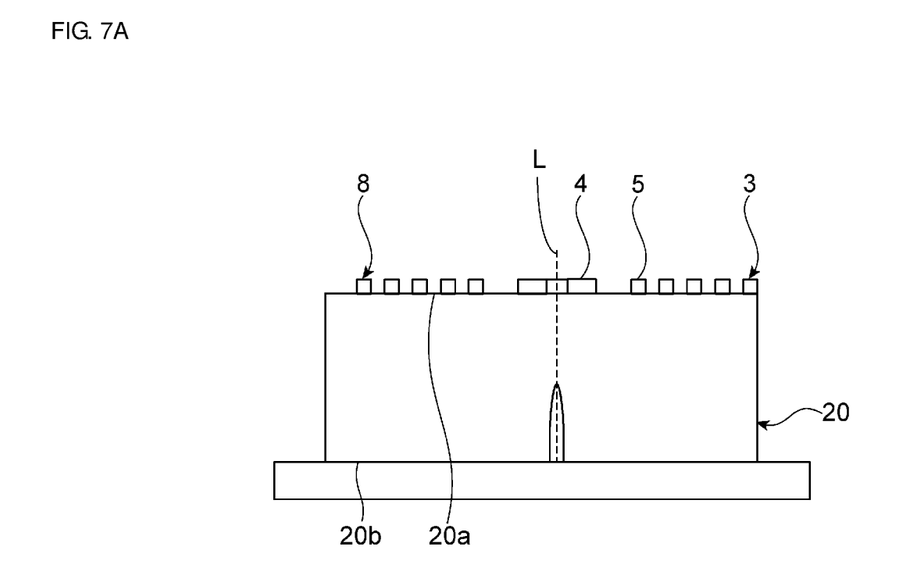
FIGS. 7A and 7B are schematic front views for describing a breaking method in the manufacturing method for the elastic wave device according to the first preferred embodiment of the present invention.
Figure 7B:
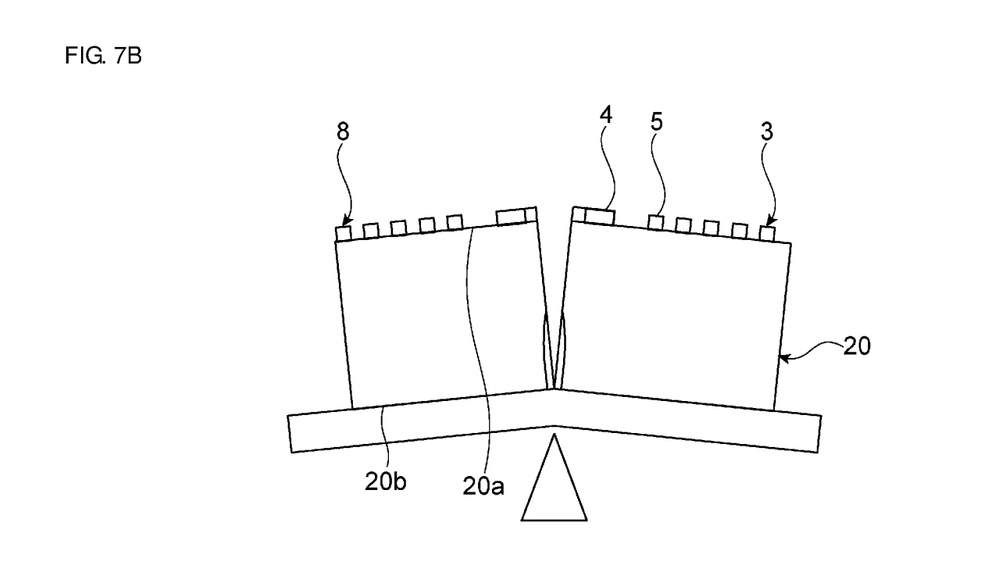

After irradiation with the laser light 9, the mother piezoelectric body 20 and the wiring electrode 4 are broken along the split line L as illustrated in FIGS. 7A and 7B. As a result, the mother piezoelectric body 20 on which the plurality IDT electrodes and the wiring electrode 4 are formed is able to be singulated, and the elastic wave device 1 is manufactured.

As described above, in the case of emitting the laser light 9 from the side of the second main surface 20b, the elastic wave device 1 is able to be manufactured without the wiring electrode 4 being irradiated with the laser light 9. Therefore, conductive debris (scraps left after laser processing), which is scattered when the wiring electrode 4 is irradiated with the laser light 9, is less likely to be scattered. The conductive debris is less likely to be scattered, and therefore, a short circuit between electrodes is less likely to occur. Therefore, it is possible that the characteristics of the elastic wave device 1 are less likely to be degraded.

Further, in the present preferred embodiment, it is preferable that the radius of curvature of the end portions 4a of the wiring electrode 4 illustrated in FIG. 1, that is, the radius of curvature of the wiring electrode 4 at the edge 2c, be equal to or less than about 3 μm, for example. In this case, stress is able to be more intensively applied to the end portions 4a of the wiring electrode 4 located on the split line L. Therefore, when the mother piezoelectric body 20 is split, the wiring electrode 4 is able to be cleanly split, and burrs from the wiring electrode 4 are much less likely to be produced.

The fact that stress is able to be intensively applied to the end portions 4a by setting the radius of curvature of the end portions 4a to about 3 μm or less is supported by the following stress simulation.

Figure 8:
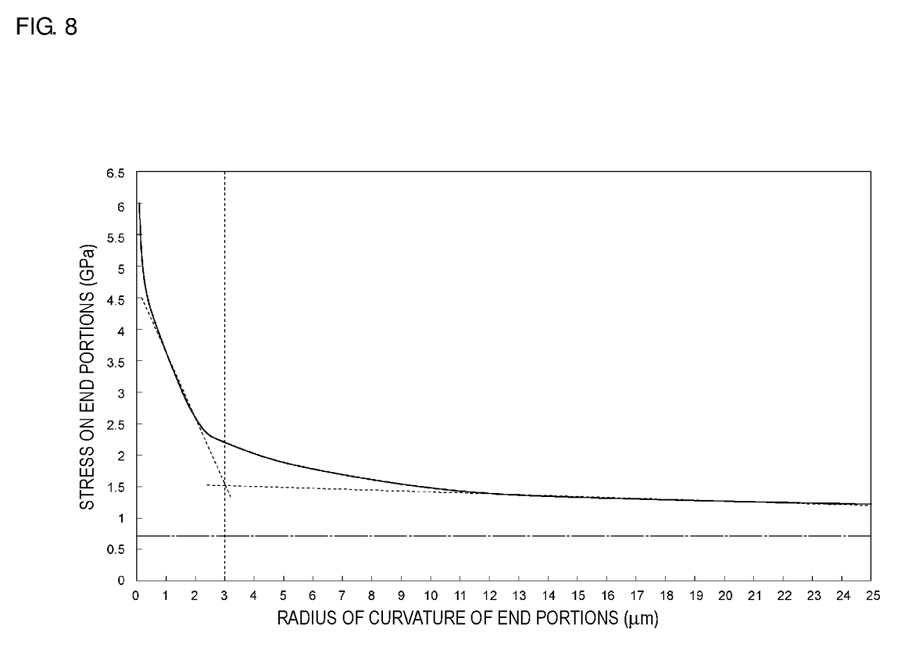
FIG. 8 is a graph illustrating a relationship between the radius of curvature of and the stress on end portions of a wiring electrode.

FIG. 8 is a graph illustrating a relationship between the radius of curvature of and the stress on the end portions of the wiring electrode. Note that, for comparison, the dashed dotted line in FIG. 8 represents the stress on the end portions 4a in a case in which the end portions 4a and the remaining portion 4b of the wiring electrode 4 have the same width. Specifically, in the case in which the end portions 4a and the remaining portion 4b of the wiring electrode 4 have the same width, the stress is about 0.685 GPa.

Note that the stress on the end portions 4a illustrated in FIG. 8 is calculated as follows.

Material of Wiring Electrode 4: Al
Dimensions: The width and thickness of the remaining portion 4b of the wiring electrode 4 are about 24 μm and about 1 μm respectively.
Tensile Amount: about 1 μm With the above-described conditions, the stress on the end portions 4a is calculated.

As illustrated in FIG. 8, in the case in which the radius of curvature of the end portions 4a is equal to or less than about 3 μm, it was discovered that stress is more intensively applied to the end portions 4a. Accordingly, with the manufacturing method according to the present preferred embodiment, when the wiring electrode 4 is split, stress is intensively applied to the end portions 4a of the wiring electrode 4. Therefore, with the manufacturing method according to the present preferred embodiment, the wiring electrode 4 is able to be cleanly split, and burrs from the wiring electrode 4 are less likely to be produced.

Second Preferred Embodiment

Figure 9:
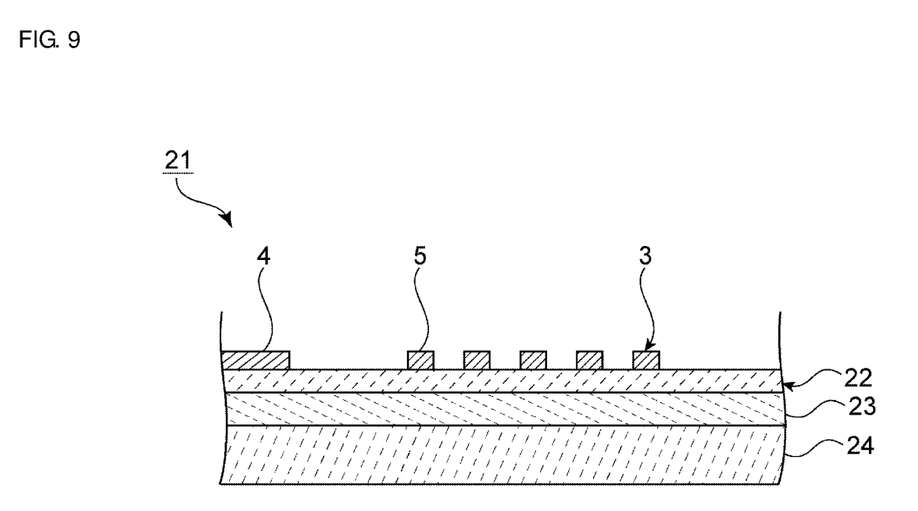
FIG. 9 is a schematic elevational cross-sectional view of an elastic wave device according to a second preferred embodiment of the present invention.

FIG. 9 is a schematic elevational cross-sectional view of an elastic wave device according to a second preferred embodiment of the present invention.

As illustrated in FIG. 9, an elastic wave device 21 further includes a low-acoustic-velocity film 23 and a high-acoustic-velocity member 24. The acoustic velocity of a bulk wave propagating through the low-acoustic-velocity film 23 is lower than the acoustic velocity of an elastic wave propagating through a piezoelectric body 22. On the other hand, the acoustic velocity of a bulk wave propagating through the high-acoustic-velocity member 24 is higher than the acoustic velocity of the elastic wave propagating through the piezoelectric body 22.

As illustrated in FIG. 9, the low-acoustic-velocity film 23 is provided on the high-acoustic-velocity member 24. In the elastic wave device 21, the piezoelectric body 22 is provided on the low-acoustic-velocity film 23.

In the present preferred embodiment, the piezoelectric body 22 is preferably a piezoelectric thin film, for example. The piezoelectric thin film is not specifically limited and may preferably be made of, for example, a piezoelectric single crystal, such as $LiNbO_3$ or $LiTaO_3$, or a suitable piezoelectric ceramic. Note that, when the wavelength determined based on the electrode finger pitch of the IDT electrode 5 is represented by λ, it is preferable to set the thickness of the piezoelectric body 22 to about 3.5λ or less, for example.

In the present preferred embodiment, silicon oxide, for example, is preferably used as the low-acoustic-velocity film 23. However, as the low-acoustic-velocity film 23, any suitable material with which the acoustic velocity of the bulk wave propagating through the low-acoustic-velocity film 23 is lower than the acoustic velocity of the elastic wave propagating through the piezoelectric body 22 may be used. As such a material, a medium mainly containing silicon oxide, glass, silicon oxynitride, tantalum oxide, or a compound containing silicon oxide doped with fluorine, carbon, or boron, for example, may be used.

The high-acoustic-velocity member 24 confines a surface acoustic wave in a portion in which the piezoelectric body 22 and the low-acoustic-velocity film 23 are stacked so that the surface acoustic wave does not leak into a structure below the high-acoustic-velocity member 24. In the present preferred embodiment, the high-acoustic-velocity member 24 is preferably made of, for example, aluminum nitride. However, as long as the surface acoustic wave is able to be confined, various high-acoustic-velocity materials, such as aluminum nitride, aluminum oxide, silicon carbide, silicon nitride, silicon oxynitride, a DLC film, diamond, a medium mainly containing these materials, or a medium mainly containing a mixture of these materials, for example, may be used.

In a non-limiting example of a manufacturing method for the elastic wave device 21, the plurality of IDT electrodes 5 and the wiring electrode 4 are formed on the first main surface of a mother piezoelectric body. On the second main surface of the mother piezoelectric body, the low-acoustic-velocity film 23 and the high-acoustic-velocity member 24 are formed in this order. Further, in a case in which the mother piezoelectric body is irradiated with laser light, the laser light is emitted to the mother piezoelectric body from the side of the high-acoustic-velocity member 24. The remainder of the method is the same or substantially the same as that in the first preferred embodiment.

Also in the elastic wave device 21, the width of the wiring electrode 4 on the edge of the main surface of the piezoelectric body 22 is narrower than the width of the wiring electrode 4 in a portion not on the edge, and therefore, burrs from the wiring electrode 4 are less likely to be produced.

Third Preferred Embodiment

Figure 10:
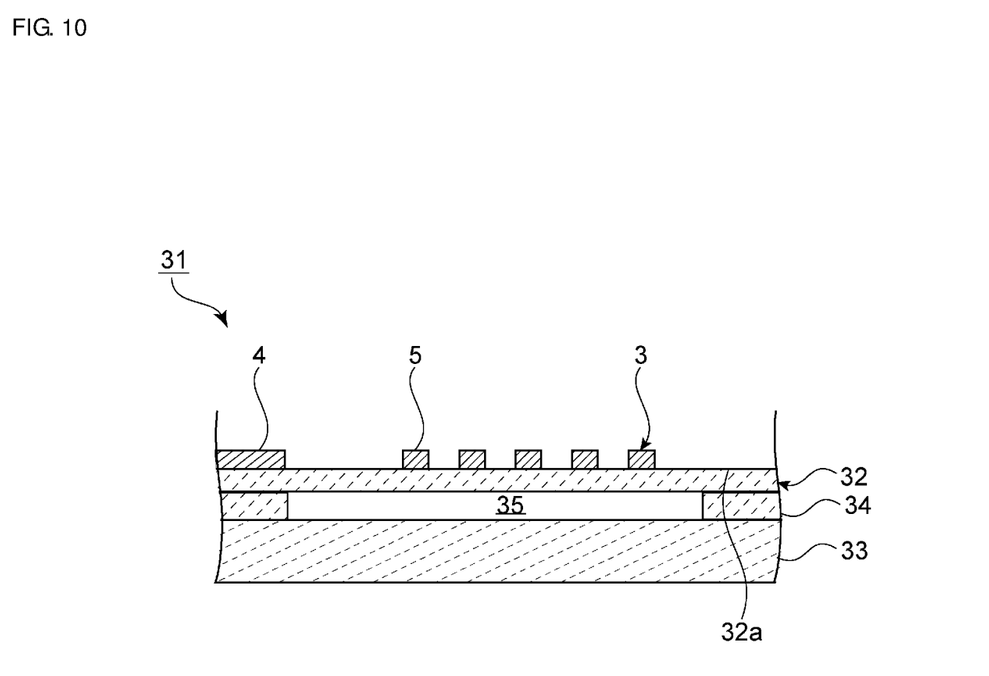
FIG. 10 is a schematic elevational cross-sectional view of an elastic wave device according to a third preferred embodiment of the present invention.

FIG. 10 is a schematic elevational cross-sectional view of an elastic wave device according to a third preferred embodiment of the present invention.

As illustrated in FIG. 10, a hollow portion 35 is provided in an elastic wave device 31. On a support substrate 33, a support layer 34 and a piezoelectric body 32 are stacked so as to enclose the hollow portion 35. The piezoelectric body 32 includes a first main surface 32a on which the IDT electrode 5 and the wiring electrode 4 are provided as in the case of the first preferred embodiment. Above an area in which the hollow portion is provided, the IDT electrode 5 is provided on the piezoelectric body 32. Alternatively, the elastic wave device 31 may have a membrane structure in which a portion of the piezoelectric body 32 that is excited by the IDT electrode 5 faces the hollow portion 35. In this case, the hollow portion 35 may be provided within the support substrate 33, or the elastic wave device 31 may have a membrane structure in which a structural element that penetrates the support substrate 33 is provided, instead of the hollow portion 35.

The elastic wave device 31 preferably uses a plate wave as a propagating elastic wave. Here, the piezoelectric body 32 having a thickness equal to or less than the wavelength of the elastic wave is used, and a wave in which most of the elastic wave energy is concentrated in the piezoelectric body 32 is referred to as a plate wave. Therefore, the elastic wave device 31 is not limited to a hollow structure in which the piezoelectric body 32 is a thin plate or a thin film, and various thin films may be provided under the thin piezoelectric body 32 to concentrate most of the elastic wave energy in the piezoelectric body 32, or the support substrate 33 may support the piezoelectric body 32 and these thin films.

In a case of using a plate wave as in the present preferred embodiment, when the wavelength determined based on the electrode finger pitch of the IDT electrode 5 is represented by $\lambda$, it is preferable to set the thickness of the piezoelectric body 32 to about $1\lambda$ or less, for example. In this case, the plate waves are able to be further excited.

In a non-limiting example of a manufacturing method for the elastic wave device 31, the plurality of IDT electrodes 5 and the wiring electrode 4 are formed on the first main surface of a mother piezoelectric body. On the second main surface of the mother piezoelectric body, the support layer 34 and the support substrate 33 are formed in this order. In a case in which the mother piezoelectric body is irradiated with laser light, the laser light is emitted to the mother piezoelectric body from the side of the support substrate 33. The remainder of the method is the same or substantially the same as that in the first preferred embodiment.

Also in the elastic wave device 31, the width of the wiring electrode 4 on the edge of the first main surface 32a is narrower than the width of the wiring electrode 4 in a portion not on the edge, and therefore, burrs from the wiring electrode 4 are less likely to be produced.

The elastic wave devices according to the above-described preferred embodiments may preferably be used as, for example, a duplexer of a radio-frequency front-end circuit. This example is described below.

Figure 11:
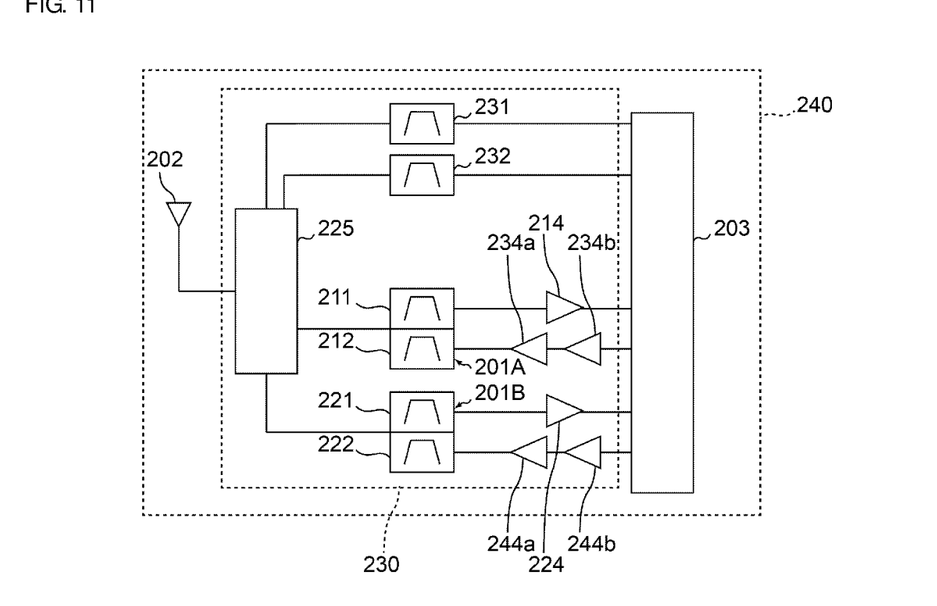
FIG. 11 is a diagram illustrating a configuration of a communication device and a radio-frequency front-end circuit according to a preferred embodiment of the present invention.

FIG. 11 is a diagram illustrating a configuration of a communication device and a radio-frequency front-end circuit according to a preferred embodiment of the present invention. In FIG. 11, elements connected to a radio-frequency front-end circuit 230, such as an antenna element 202 and an RF signal processing circuit (RFIC) 203, are also illustrated. The radio-frequency front-end circuit 230 and the RF signal processing circuit 203 define a communication device 240. Note that the communication device 240 may include a power supply, a CPU, and a display, for example.

The radio-frequency front-end circuit 230 includes a switch 225, duplexers 201A and 201B, filters 231 and 232, low-noise amplifier circuits 214 and 224, and power amplifier circuits 234a, 234b, 244a, and 244b. Note that the radio-frequency front-end circuit 230 and the communication device 240 illustrated in FIG. 11 are examples of the radio-frequency front-end circuit and the communication device, and the configuration is not limited to this.

The duplexer 201A includes filters 211 and 212. The duplexer 201B includes filters 221 and 222. The duplexers 201A and 201B are connected to the antenna element 202 with the switch 225 interposed between the antenna element 202 and the duplexers 201A and 201B. Note that any of the elastic wave devices described above may be used for the duplexers 201A and 201B or the filters 211, 212, 221, and 222.

Further, any of the elastic wave devices described above is applicable to a multiplexer including three or more filters, such as a triplexer in which an antenna element is used in common by three filters or a hexaplexer in which an antenna element is used in common by six filters.

That is, any of the elastic wave devices described above may be used as an elastic wave resonator, a filter, a duplexer, and a multiplexer including three or more filters. The configuration of the multiplexer is not limited to a configuration in which both transmission filters and reception filters are included and may be a configuration in which only transmission filters or only reception filters are included.

The switch 225 connects the antenna element 202 with a signal path that corresponds to a predetermined band in accordance with a control signal from a controller (not illustrated), and is preferably defined by, for example, an SPDT (single pole double throw) switch. Note that the number of signal paths that are connected to the antenna element 202 is not limited to one and may be two or more. That is, the radio-frequency front-end circuit 230 may handle carrier aggregation.

The low-noise amplifier circuit 214 is a reception amplifier circuit that amplifies a radio-frequency signal (here, a radio-frequency reception signal) that has passed through the antenna element 202, the switch 225, and the duplexer 201A, and outputs the amplified signal to the RF signal processing circuit 203. The low-noise amplifier circuit 224 is a reception amplifier circuit that amplifies a radio-frequency signal (here, a radio-frequency reception signal) that has passed through the antenna element 202, the switch 225, and the duplexer 201B, and outputs the amplified signal to the RF signal processing circuit 203.

The power amplifier circuits 234a and 234b are transmission amplifier circuits that amplify a radio-frequency signal (here, a radio-frequency transmission signal) output from the RF signal processing circuit 203, and output the amplified signal to the antenna element 202 via the duplexer 201A and the switch 225. The power amplifier circuits 244a and 244b are transmission amplifier circuits that amplify a radio-frequency signal (here, a radio-frequency transmission signal) output from the RF signal processing circuit 203, and output the amplified signal to the antenna element 202 via the duplexer 201B and the switch 225.

The RF signal processing circuit 203 performs signal processing including down-conversion, for example, on a radio-frequency reception signal input from the antenna element 202 via a reception signal path and outputs a reception signal generated as a result of the signal processing. The RF signal processing circuit 203 performs signal processing including up-conversion, for example, on an input transmission signal and outputs a radio-frequency transmission signal generated as a result of the signal processing to the power amplifier circuits 234a and 234b, or the power amplifier circuits 244a and 244b. The RF signal processing circuit 203 is preferably, for example, an RFIC. Note that the communication device may include a BB (baseband) IC. In this case, the BBIC performs signal processing on a reception signal that has been processed by the RFIC. The BBIC performs signal processing on a transmission signal and outputs the processed signal to the RFIC. The reception signal that has been processed by the BBIC and the transmission signal before signal processing by the BBIC are, for example, image signals or audio signals.

Note that the radio-frequency front-end circuit 230 may include duplexers that are modified from the duplexers 201A and 201B, instead of the duplexers 201A and 201B.

The filters 231 and 232 in the communication device 240 are connected between the RF signal processing circuit 203 and the switch 225 without the low-noise amplifier circuits 214 and 224 and the power amplifier circuits 234a, 234b, 244a, and 244b interposed therebetween. The filters 231 and 232 are connected to the antenna element 202 with the switch 225 interposed between the antenna element 202 and the filters 231 and 232, similarly to the duplexers 201A and 201B.

The radio-frequency front-end circuit 230 and the communication device 240 include, for example, an elastic wave resonator, a filter, a duplexer, or a multiplexer including three or more filters, which is an elastic wave device according to a preferred embodiment of the present invention, and therefore, burrs from a metal layer, such as the wiring electrode, are less likely to be produced.

The elastic wave device, the radio-frequency front-end circuit, and the communication device according to preferred embodiments of the present invention have been described with reference to the preferred embodiments and modifications described above. However, other preferred embodiments obtained by combining any elements in the above-described preferred embodiments and modifications, modifications obtained by making various modifications conceived by a person skilled in the art to the above-described preferred embodiments without departing from the spirit and scope of the present invention, and various devices that include the radio-frequency front-end circuits and the communication devices according to preferred embodiments of the present invention are also included in the present invention.

Preferred embodiments of the present invention may be widely used in communication devices, such as mobile phones, for example, as an elastic wave resonator, a filter, a multiplexer applicable to multiband systems, front-end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric body including a main surface;
    an IDT electrode provided on the main surface of the piezoelectric body; and
    a wiring electrode provided on the main surface of the piezoelectric body and electrically connected to the IDT electrode; wherein
    the wiring electrode includes a portion that extends to an edge of the main surface of the piezoelectric body;
    a width of the wiring electrode on the edge is narrower than a width of the wiring electrode in a portion not on the edge; and
    a radius of curvature of the wiring electrode at the edge is equal to or less than about 3 μm.

2. The elastic wave device according to claim 1, further comprising:
    a high-acoustic-velocity member through which a bulk wave propagates at an acoustic velocity higher than an acoustic velocity of an elastic wave that propagates through the piezoelectric body; and
    a low-acoustic-velocity film that is stacked on the high-acoustic-velocity member and through which a bulk wave propagates at an acoustic velocity lower than the acoustic velocity of the elastic wave that propagates through the piezoelectric body; wherein
    the piezoelectric body is provided on the low-acoustic-velocity film.

3. The elastic wave device according to claim 2, wherein when a wavelength determined based on an electrode finger pitch of the IDT electrode is represented by $\lambda$, a thickness of the piezoelectric body is equal to or less than about 3.5 $\lambda$.

4. The elastic wave device according to claim 1, further comprising:
    a support substrate; and
    a support layer stacked on the support substrate; wherein
    the piezoelectric body is stacked on the support layer; and
    a hollow portion is enclosed by the support substrate, the support layer, and the piezoelectric body.

5. A radio-frequency front-end circuit comprising:
    the elastic wave device according to claim 1; and
    a power amplifier.

6. The radio-frequency front-end circuit according to claim 5, further comprising:
    a high-acoustic-velocity member through which a bulk wave propagates at an acoustic velocity higher than an acoustic velocity of an elastic wave that propagates through the piezoelectric body; and
    a low-acoustic-velocity film that is stacked on the high-acoustic-velocity member and through which a bulk wave propagates at an acoustic velocity lower than the acoustic velocity of the elastic wave that propagates through the piezoelectric body; wherein
    the piezoelectric body is provided on the low-acoustic-velocity film.

7. The radio-frequency front-end circuit according to claim 6, wherein when a wavelength determined based on an electrode finger pitch of the IDT electrode is represented by $\lambda$, a thickness of the piezoelectric body is equal to or less than about 3.5 $\lambda$.

8. The radio-frequency front-end circuit according to claim 5, further comprising:
    a support substrate; and
    a support layer stacked on the support substrate; wherein
    the piezoelectric body is stacked on the support layer; and
    a hollow portion is enclosed by the support substrate, the support layer, and the piezoelectric body.

9. A communication device comprising:
    the radio-frequency front-end circuit according to claim 5; and
    an RF signal processing circuit.

10. The communication device according to claim 9, further comprising:
    a high-acoustic-velocity member through which a bulk wave propagates at an acoustic velocity higher than an acoustic velocity of an elastic wave that propagates through the piezoelectric body; and a low-acoustic-velocity film that is stacked on the high-acoustic-velocity member and through which a bulk wave propagates at an acoustic velocity lower than the acoustic velocity of the elastic wave that propagates through the piezoelectric body; wherein the piezoelectric body is provided on the low-acoustic-velocity film.

11. The communication device according to claim 10, wherein when a wavelength determined based on an electrode finger pitch of the IDT electrode is represented by $\lambda$, a thickness of the piezoelectric body is equal to or less than about 3.5 $\lambda$.

12. The communication device according to claim 9, wherein further comprising:

a support substrate; and a support layer stacked on the support substrate; wherein the piezoelectric body is stacked on the support layer; and a hollow portion is enclosed by the support substrate, the support layer, and the piezoelectric body.

* * * * *